(12) United States Patent
Ting

(10) Patent No.: US 10,923,423 B2
(45) Date of Patent: Feb. 16, 2021

(54) INTERCONNECT STRUCTURE FOR SEMICONDUCTOR DEVICES

(71) Applicant: Taiwan Semiconductor Manufacturing Company, Ltd., Hsinchu (TW)

(72) Inventor: Chih-Yuan Ting, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/600,171

(22) Filed: Oct. 11, 2019

(65) Prior Publication Data

US 2020/0043851 A1 Feb. 6, 2020

Related U.S. Application Data

(60) Continuation of application No. 15/425,778, filed on Feb. 6, 2017, now Pat. No. 10,453,794, which is a division of application No. 14/100,753, filed on Dec. 9, 2013, now Pat. No. 9,564,355.

(51) Int. Cl.
*H01L 23/528* (2006.01)
*H01L 21/768* (2006.01)
*H01L 23/532* (2006.01)

(52) U.S. Cl.
CPC ...... *H01L 23/5283* (2013.01); *H01L 21/7682* (2013.01); *H01L 21/76811* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,847,464 | A | * | 12/1998 | Singh ................ H01L 21/31 257/752 |
| 7,042,095 | B2 | * | 5/2006 | Noguchi .......... H01L 21/76801 257/203 |
| 7,190,043 | B2 | | 3/2007 | Bhattacharyya et al. |
| 7,284,307 | B2 | | 10/2007 | Yamasaki et al. |
| 7,608,909 | B2 | | 10/2009 | Chinthakindi et al. |
| 7,749,891 | B2 | | 7/2010 | Ueda |
| 7,803,713 | B2 | | 9/2010 | Chen et al. |
| 7,973,409 | B2 | | 7/2011 | Yang et al. |
| 2003/0146495 | A1 | | 8/2003 | Tamaoka et al. |
| 2006/0057835 | A1 | | 3/2006 | Anderson et al. |

(Continued)

FOREIGN PATENT DOCUMENTS

| CN | 101231969 A | 7/2008 |
|---|---|---|
| JP | 2005136152 A | 5/2005 |

(Continued)

*Primary Examiner* — Robert K Carpenter
(74) *Attorney, Agent, or Firm* — Slater Matsil, LLP

(57) ABSTRACT

An interconnect and a method of forming an interconnect for a semiconductor device is provided. Conductive lines having different widths are formed. Wider conductive lines are used where the design includes an overlying via, and narrower lines are used in which an overlying via is not included. An overlying dielectric layer is formed and trenches and vias are formed extending through the overlying dielectric layer to the wider conductive lines. Voids or air gaps may be formed adjacent select conductive lines, such as the narrower lines.

20 Claims, 8 Drawing Sheets

(56) References Cited

U.S. PATENT DOCUMENTS

2008/0182405 A1 7/2008 Liu et al.
2009/0278261 A1 11/2009 Harada et al.
2011/0260326 A1* 10/2011 Clevenger ......... H01L 21/02126
　　　　　　　　　　　　　　　　　　　257/770

FOREIGN PATENT DOCUMENTS

JP　　　　4584700 B2　　11/2010
KR　　100818108 B1　　3/2008

* cited by examiner

INTERCONNECT STRUCTURE FOR SEMICONDUCTOR DEVICES

PRIORITY CLAIM AND CROSS-REFERENCE

This application is a continuation of U.S. patent application Ser. No. 15/425,778, filed Feb. 6, 2017 and entitled "Interconnect Structure for Semiconductor Devices," which is a divisional of U.S. patent application Ser. No. 14/100,753, filed Dec. 9, 2013 and entitled "Interconnect Structure for Semiconductor Devices," now U.S. Pat. No. 9,564,355, which applications are incorporated herein in their entireties.

BACKGROUND

In integrated circuit art, a commonly used method for forming interconnect structures, which include metal lines and vias, is known as "damascene." Generally, this method involves forming an opening in a dielectric layer, which separates the vertically spaced metallization layers. The opening is typically formed using lithographic and etching techniques. After the formation, the opening is filled with copper or copper alloys. Excess copper on the surface of the dielectric layer is then removed by a chemical mechanical polish (CMP). The remaining copper or copper alloy forms vias and/or metal lines.

Copper is commonly used in damascene structures because of its low resistivity. Typically, an interconnect structure is formed of a plurality of metallization layers, each including a plurality of copper lines. Copper lines in different metallization layers are interconnected by vias. While copper is generally used due to its electrical characteristics, other materials may be used.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Methods for forming metal features in metallization layers of integrated circuits are provided. The intermediate stages of manufacturing embodiments of the present invention are illustrated. Throughout various views and illustrative embodiments, like reference numbers are used to designate like elements.

As will be discussed in greater detail below, conductive lines are formed having different widths. Wider conductive lines are utilized where an overlying via is desired. The wider conductive lines reduces the electron migration and helps reduce or prevent void formation. Narrower conductive lines are utilized where overlying vias are omitted. Furthermore, in other embodiments, voids may be created adjacent the narrower lines to provide additional insulation between conductive lines.

Figure 1:
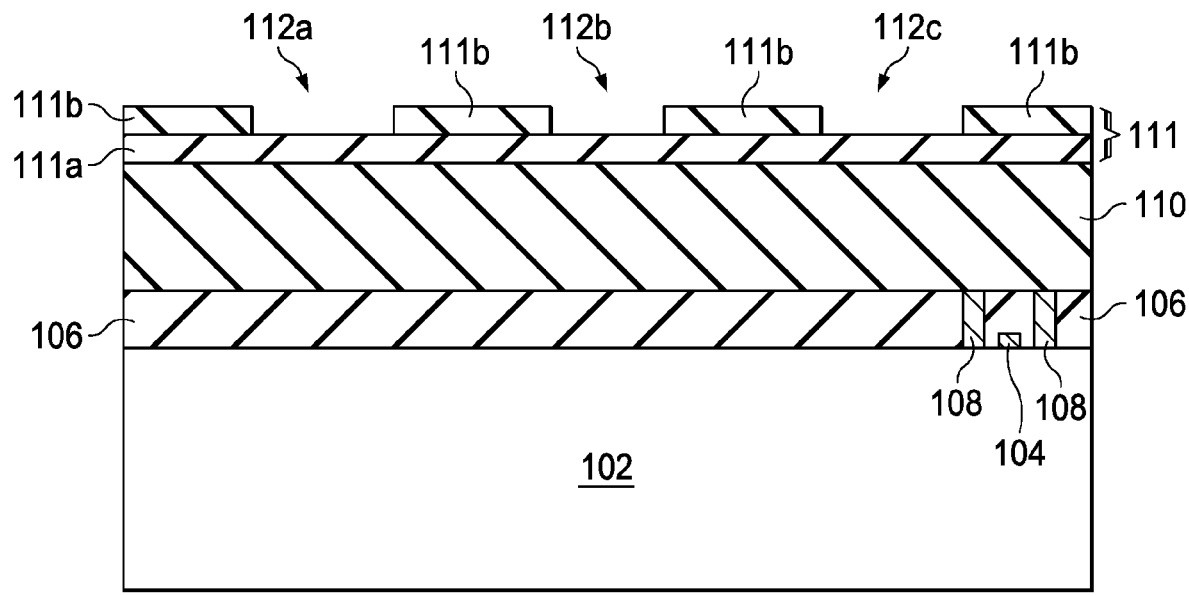
FIGS. 1-6 illustrate various intermediate stages in a manufacture of a semiconductor device in accordance with an embodiment.

FIGS. 1-6 illustrate various intermediate stages of a method of forming a semiconductor device in accordance with an embodiment. Referring first to FIG. 1, there is shown a substrate 102 having electrical circuitry (illustrated collectively by electrical circuitry 104) formed thereon. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 104 formed on the substrate 102 may be any type of circuitry suitable for a particular application. For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is a first dielectric layer 106, such as an inter-layer dielectric (ILD) layer. The first dielectric layer 106 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first dielectric layer 106 may comprise a plurality of dielectric layers.

Contacts 108 are formed through the first dielectric layer 106 to provide an electrical contact to the electrical circuitry 104. The contacts 108 may be formed, for example, by using photolithography techniques to deposit and pattern a photoresist material on the first dielectric layer 106 to expose portions of the first dielectric layer 106 that are to become the contacts 108. An etch process, such as an anisotropic dry etch process, may be used to create openings in the first dielectric layer 106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming the contacts 108 as illustrated in FIG. 1.

A second dielectric layer 110, such as an inter-metal dielectric (IMD) layer, is formed over the first dielectric layer 106. Generally, the ILD and IMD layers, such as the first dielectric layer 106 and the second dielectric layer 110, and the associated metallization layers are used to interconnect the electrical circuitry to each other and to provide an external electrical connection. The second dielectric layer 110 may be formed of a low-K dielectric material, such as FSG formed by PECVD techniques or high-density plasma chemical vapor deposition (HDPCVD) or the like, and may include intermediate etch stop layers. The ILD layer and/or IMD layers may be formed of a low-K dielectric material (dielectric constant k less than silicon dioxide), a ultra low-k dielectric (a dielectric constant less than about 2.9), or even an extreme low-k (ELK) dielectric (a dielectric constant less than about 2.5), or the like.

It should also be noted that one or more etch stop layers (not shown) may be positioned between adjacent ones of the dielectric layers, e.g., the first dielectric layer 106 and the second dielectric layer 110. Generally, the etch stop layers provide a mechanism to stop an etching process when forming vias and/or contacts. The etch stop layers are preferably formed of a dielectric material having a different etch selectivity from adjacent layers, e.g., the underlying substrate 102, the overlying first dielectric layer 106, and the overlying second dielectric layer 110. In an embodiment, etch stop layers may be formed of SiN, SiCN, SiCO, CN, combinations thereof, or the like, deposited by CVD or PECVD techniques.

Also shown in FIG. 1 is a first mask layer 111 formed over the second dielectric layer 110. The first mask layer 111 is a protective layer to prevent the underlying structures from being removed during a subsequent etching process, and may comprise one or more layers. For example, FIG. 1 illustrates an embodiment in which the first mask layer 111 includes an oxide layer 111a and a nitride layer 111b. The oxide layer may be, for example, a silicon dioxide layer formed by thermal oxidation or by chemical vapor deposition (CVD) techniques using tetra-ethyl-ortho-silicate (TEOS) and oxygen as precursor, and the nitride layer may be, for example, a silicon nitride ($Si_3N_4$) layer formed on top of the oxide layer. The $Si_3N_4$ layer may be formed using CVD techniques using silane and ammonia as precursor gases. Other mask materials can be used to form the first mask layer 111.

FIG. 1 illustrates the nitride layer 111b after patterning to form first openings 112a-c in accordance with an embodiment. As illustrated in FIG. 1, the first openings 112a and 112c have a width greater than a width of the first opening 112b. As will be discussed in greater detail below, the first openings 112a-c define shapes of conductive lines to be formed in the second dielectric layer 110. The wider conductive lines are used in locations in which a subsequently formed via extending through a subsequently formed overlying dielectric layer is to make contact. Additionally, the lines not having vias contacting (such as that defined by first opening 112b, may be made narrower.

Due to the high current density that may be present at the junction of the via and the underlying line, electron migration may cause voids to occur in the line and/or junction region. The electron migration may be avoided or reduced by enlarging the underlying lines to which the vias land. The other lines such as that defined by the first opening 112b may be shrunk in size, thereby maintaining a minimum distance between the conductive lines as required for a particular design to limit or prevent leakage current or dielectric breakdown.

The first openings 112a-c may be formed by, for example, using photolithography techniques. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the first openings 112.

Figure 2:
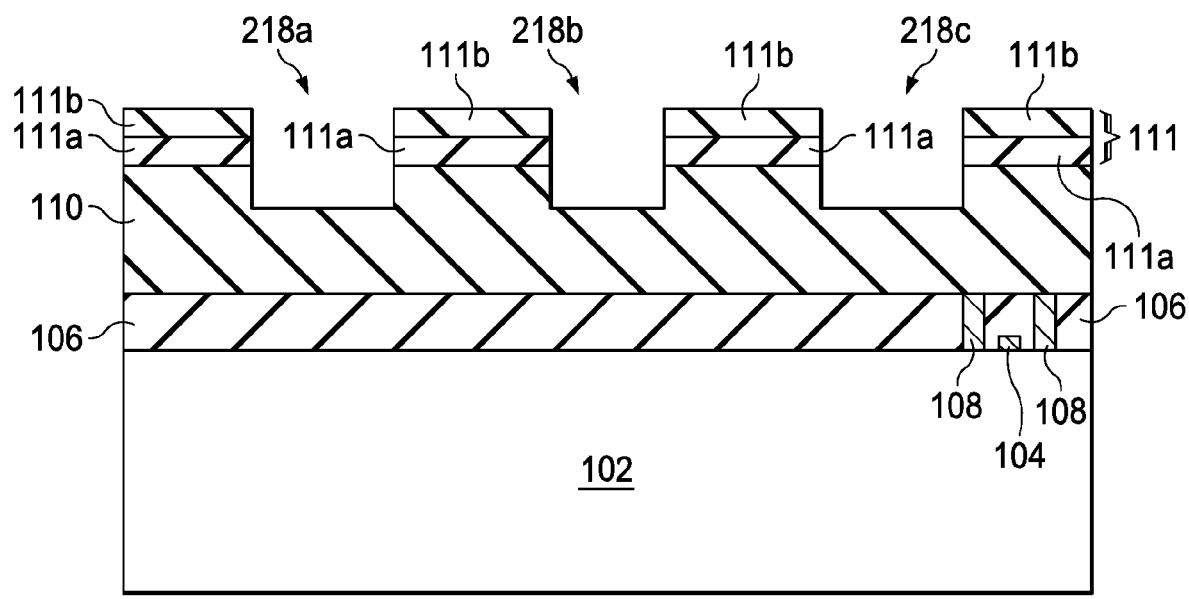

FIG. 2 illustrates the substrate 102 after second openings 218a-c have been formed in the second dielectric layer 110 in accordance with an embodiment. In an embodiment in which the second dielectric layer 110 is formed of a material such as SiC, the second dielectric layer 110 may be patterned with an anisotropic dry etch process using an etchant such as $C_4F_8$ or $C_5F_8$. In an embodiment, the etch process to form the first opening is a timed etch process in which the time the etch process is performed is selected such that the desired depth is achieved.

Figure 3:
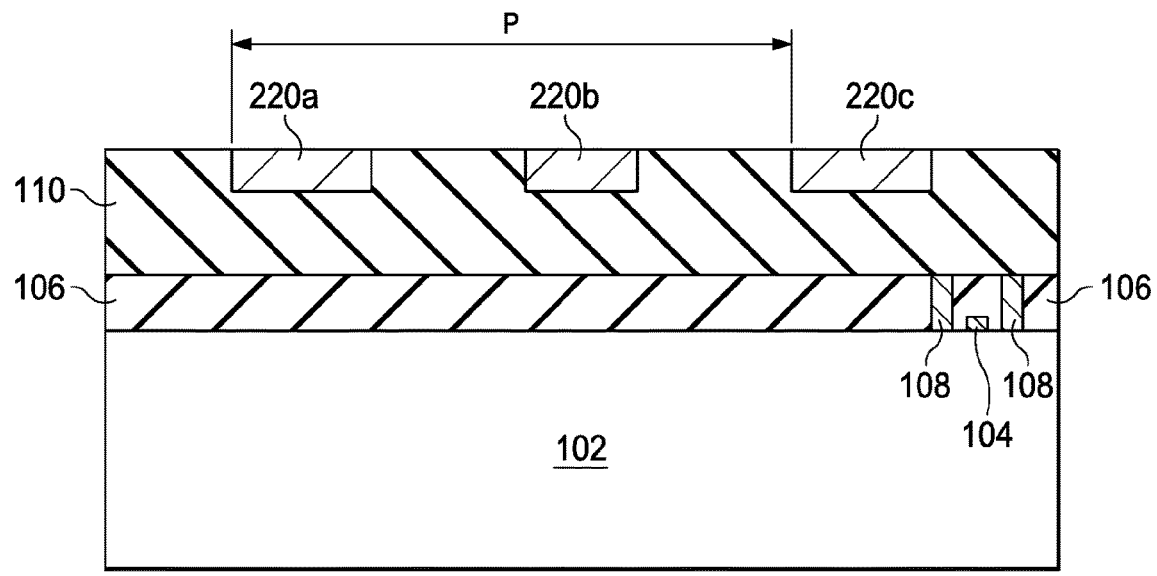

FIG. 3 illustrates filling the second openings 218a-c (see FIG. 2) with a conductive material to form conductive lines 220a-c in accordance with an embodiment. The conductive material may be deposited by CVD, electro-plating, electroless-plating, ALD, PVD, and may be formed of copper, although other suitable materials such as aluminum, tungsten, tungsten nitride, ruthenium, silver, gold, rhodium, molybdenum, nickel, cobalt, cadmium, zinc, alloys of these, combinations thereof, and the like, may alternatively be utilized. The conductive material may be deposited into the second openings 218a-c (see FIG. 2) and the deposition may be continued until the conductive material fills the second openings 218a-c and extends above the first mask layer 111 (if present).

Optionally, one or more barrier/adhesion layers (not shown) may be formed along the sidewalls of the second openings 218a-c prior to filling with the conductive material. In embodiments, such as those using a copper conductive material, a barrier layer may be desirable to limit diffusion of the copper into the surrounding dielectric materials. In an embodiment, the barrier layer may be formed of one or more layers of titanium nitride, titanium, tantalum, tantalum nitride, tungsten nitride, ruthenium, rhodium, platinum, other noble metals, other refractory metals, their nitrides, combinations of these, or the like. The barrier layer may be formed through chemical vapor deposition, although other techniques such as PVD or ALD could alternatively be used. Excess portions of the conductive material (and any optional barrier/adhesive layers) formed over the first mask layer 111 is removed using a planarization process, such as a chemical mechanical polishing process (CMP).

In an embodiment, the wider conductive lines 220a and 220c are about 1.03 to about 3 times the width of the narrower conductive line 220b. For example, the conductive lines 220a and 220c may have a width of 24.7 nm while the conductive line 220b has a width of 23.2 nm, wherein the conductive lines 220a and 220c are 1.06 times the width of conductive line 220b. In another example, the conductive lines 220a and 220c may have a width of 36 nm while the conductive line 220b has a width of 12, wherein the conductive lines 220a and 220c are 3 times the width of conductive line 220b. The widths may be adjusted for a specific application such that the wider conductive lines allow for an increased area at the junction of an overlying via and the conductive line, thereby reducing the electron current density and electron migration, which in turn reduces or prevents voids from forming.

In an embodiment, the pitch P between conductive lines 220a and 220c is about 80 nm and about 95 nm. Immersion lithography may be used to achieve a pitch P of about 80 nm in a 22 nm technology node and about 95 nm in a 28 or 32 nm technology node. Using EUV lithography, a pitch P of less than 80 nm may be obtained. A pitch of 80 nm is the current smallest pitch obtained by immersion lithography; however, through multiple patterning approaches (double-patterning/double-etching (2P2E) or self-aligned double patterning), smaller pitches may be obtained. By applying 3P3E or self-aligned quarter patterning, the wide metal to wide metal pitch can be further reduced as discussed herein.

Figure 4:
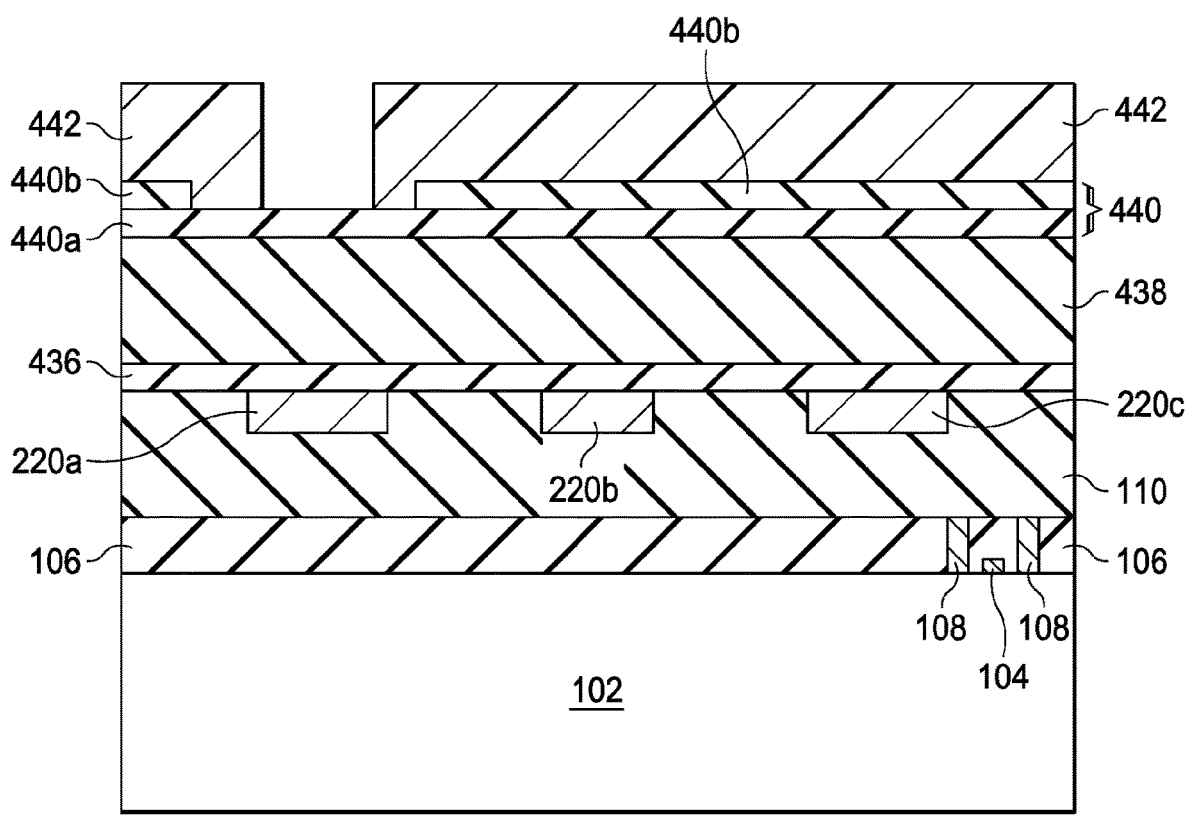

FIG. 4 illustrates an etch stop layer (ESL) 436 and a third dielectric layer 438 formed over the second dielectric layer 110 in accordance with an embodiment. Generally, the etch stop layer provides a mechanism to stop an etching process when forming vias and/or contacts. The etch stop layers are formed of a dielectric material having a different etch selectivity from adjacent layers, e.g., the underlying second dielectric layer 110. In an embodiment, etch stop layers may be formed of SiN, SiCN, SiCO, CN, combinations thereof, or the like, deposited by CVD or PECVD techniques.

Over the ESL 436 is the third dielectric layer 438 in accordance with an embodiment. As discussed in greater detail below, the third dielectric layer 438 is the layer that is to be subsequently patterned to, for example, form conductive lines and/or vias. For example, the third dielectric layer 438 may be patterned to form vias extending to one or more of the conductive lines 220a-c formed in the second dielectric layer 110. The third dielectric layer 438 may be formed of similar materials using similar processes as those used to form the first dielectric layer 106 and/or the second dielectric layer 110; however, different materials and processes may be used.

Figure 5:
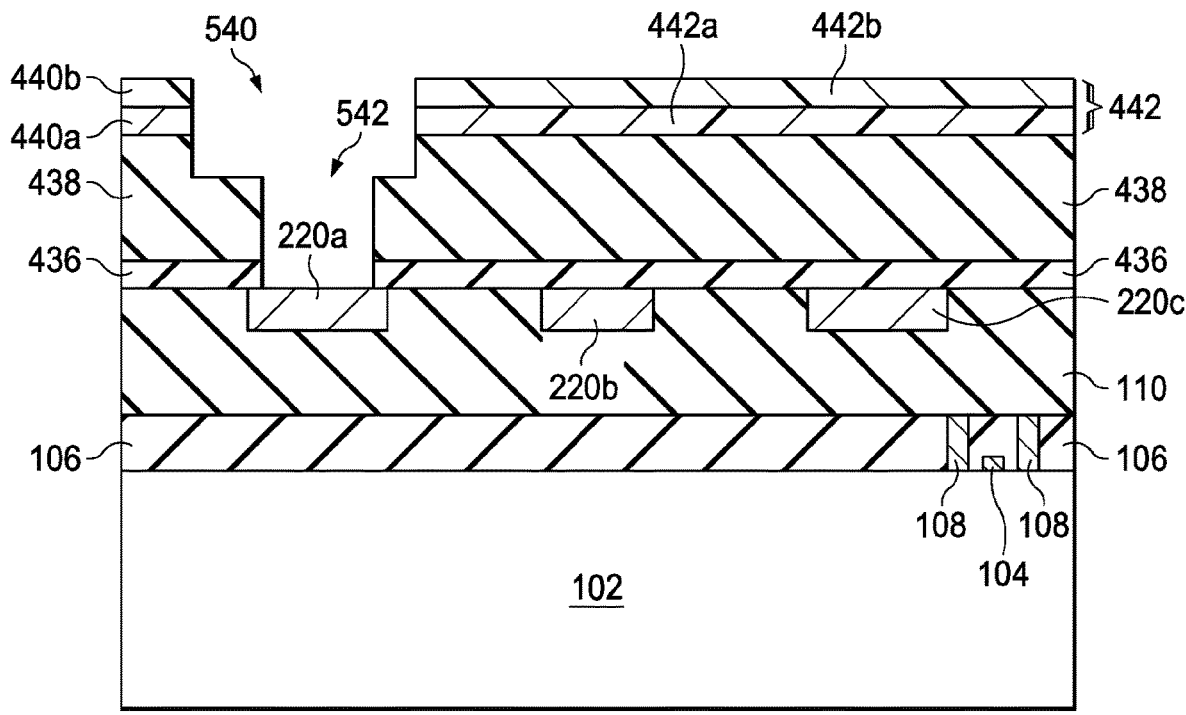

Also shown in FIG. 4 is a second mask 440 and photoresist mask 442. In an embodiment, the second mask 440 may include a multi-layer structure, such as an oxide layer 440a and a nitride layer 440b similar to the first mask 111 discussed above with reference to FIG. 1. In the embodiment illustrated in FIG. 4, the nitride layer 440b is patterned to form a trench, and an overlying photoresist is patterned for a via. During a subsequent etch process, the oxide 440a is etched corresponding to a via shape. The etch process continues to etch the third dielectric layer, while consuming the photoresist. When the photoresist is consumed, the oxide layer 440a within the trench opening is exposed. The etch process removes the exposed portions of the oxide layer 440a and etches the underlying portions of the third dielectric layer 438. The resulting pattern, as illustrated in FIG. 5, comprises a trench opening 540 with a via opening 542 extending from the bottom of the trench to an underlying conductive line, such as the conductive line 220a in this example.

Figure 6:
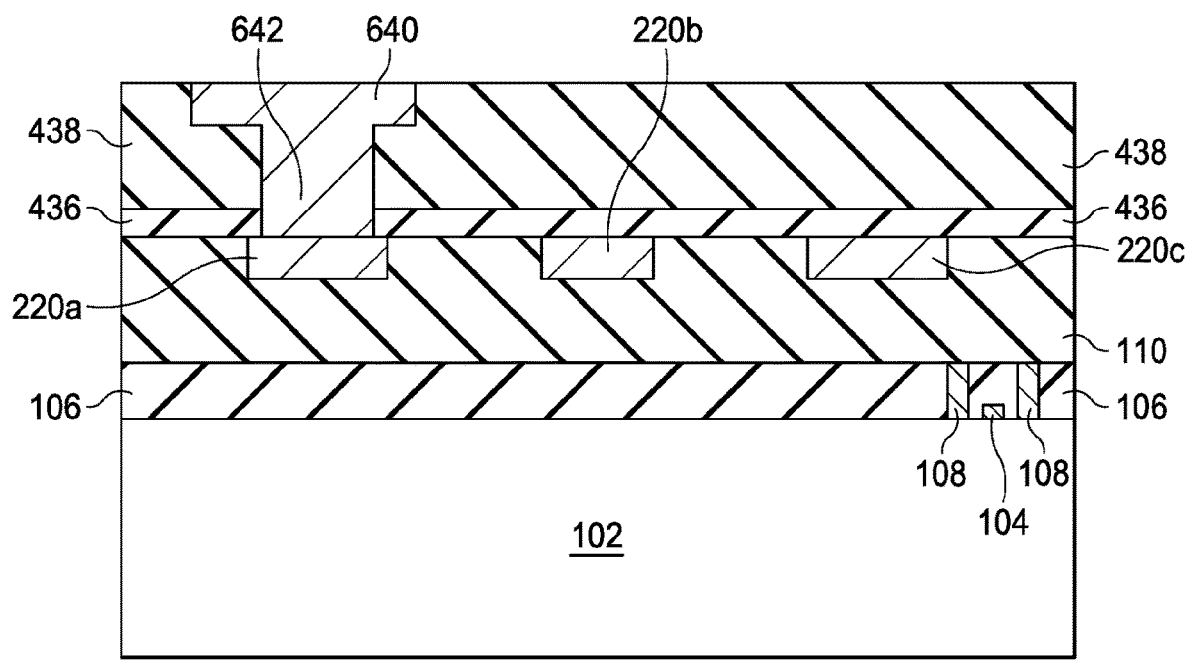

FIG. 6 illustrates filling the trench opening 540 and the via opening 542 (see FIG. 5) with a conductive material to form a conductive line 640 and via 642 in accordance with an embodiment. The conductive material may be formed of similar materials using similar processes as those used to form the conductive lines 220a-c as discussed above with reference to FIG. 3. Optionally, one or more barrier/adhesion layers (not shown) may be formed along the sidewalls of the trench opening 540 and the via opening 542 prior to forming the conductive material. Excess conductive material and the second mask layer 440 may be removed using a planarization process, such as a CMP.

Figure 7:
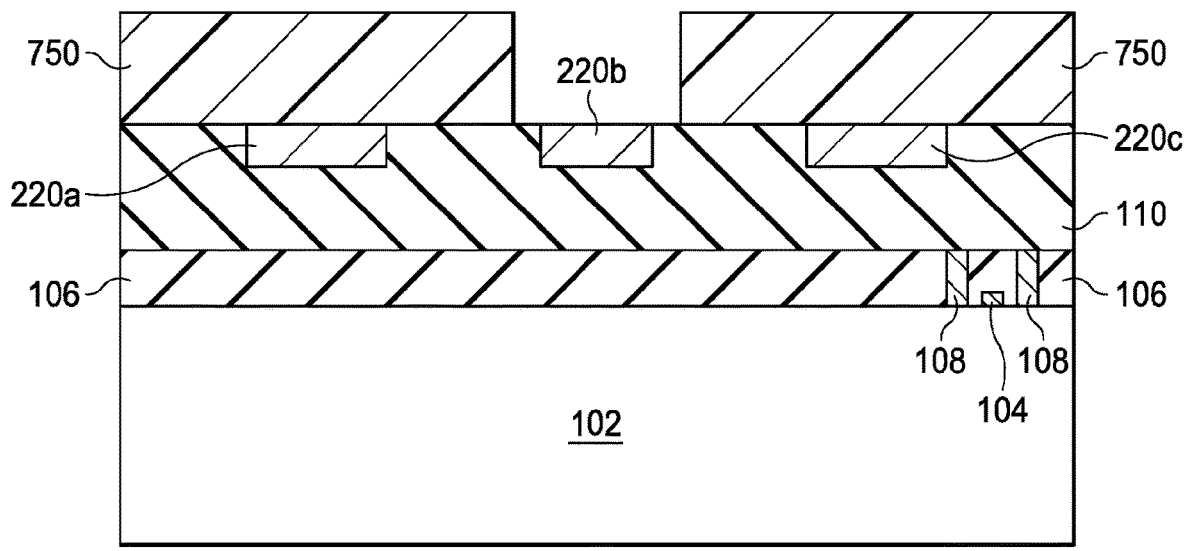
FIGS. 7-10 illustrate various intermediate stages in a manufacture of another semiconductor device in accordance with an embodiment.

FIGS. 7-10 illustrate another embodiment in which an air gap is provided adjacent one or more of the conductive lines. The process illustrated in FIGS. 7-10 assumes a process similar that discussed above with reference to FIGS. 1-3 has been previously performed. As such, FIG. 7 illustrates a patterned mask formed over a structure similar to that illustrated in FIG. 3.

Referring now to FIG. 7, there is shown a mask 750 formed over the second dielectric layer 110 such that the narrower conductive line 220b is exposed. As discussed in greater detail below, the second dielectric layer 110 adjacent to the narrower conductive line 220b is removed to allow a lower-k element, such as an air void, to be placed adjacent to the narrower conductive line 220b. The placement of the air void adjacent to the narrower conductive line reduces the interference between the various conductive lines, such as the interference with conductive lines 220a and 220c in this example.

The mask 750 may be a photoresist material that had been deposited, exposed, and developed to expose the narrower conductive line 220b and the material of the second dielectric layer 110 adjacent to the narrower conductive line 220b. In an embodiment, the mask 750 may include one or more additional masks, such as an oxide mask and/or a nitride mask such as that described above to provide additional protection during the etch process.

Figure 8:
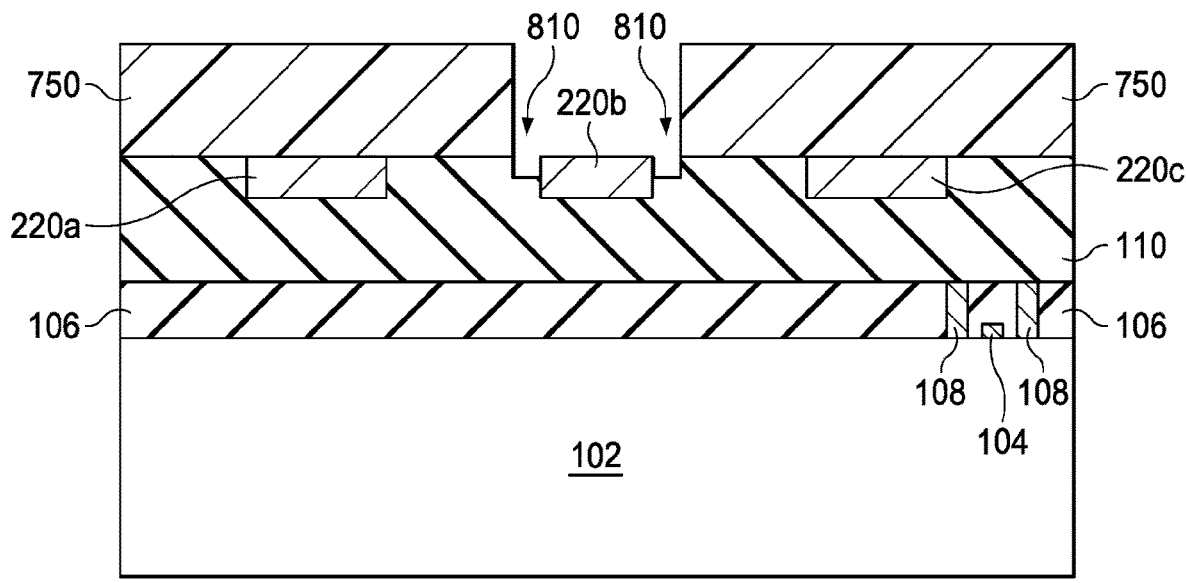
Figure 9A:
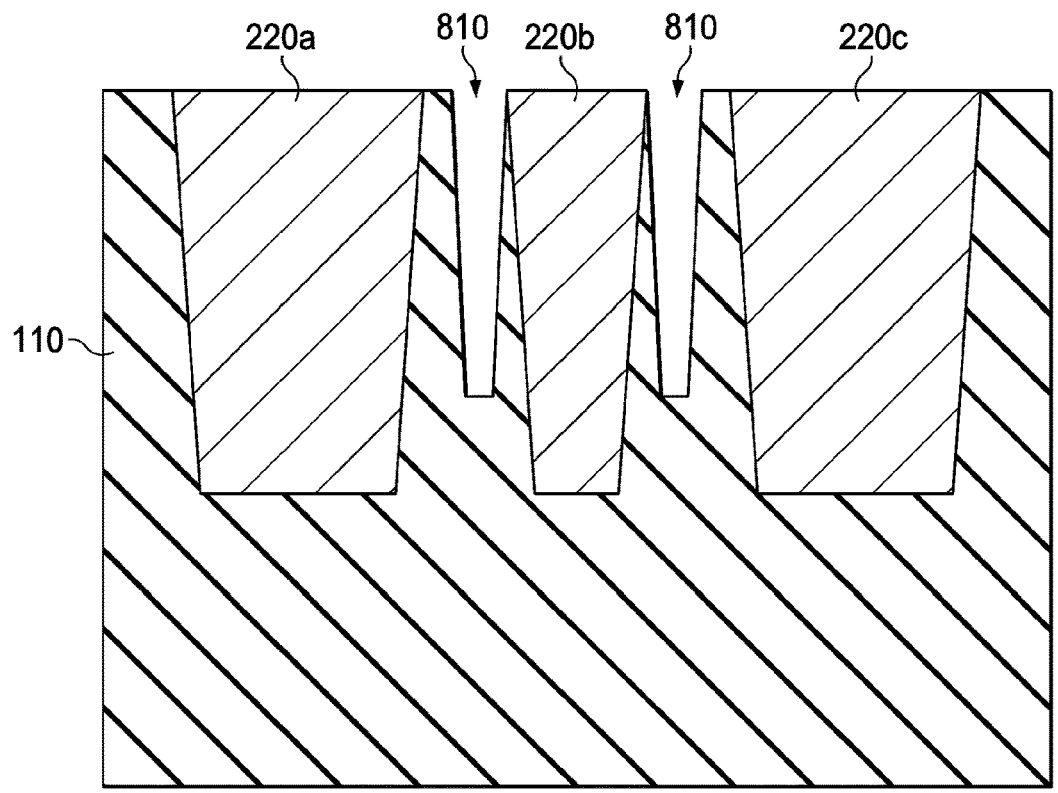
Figure 9B:
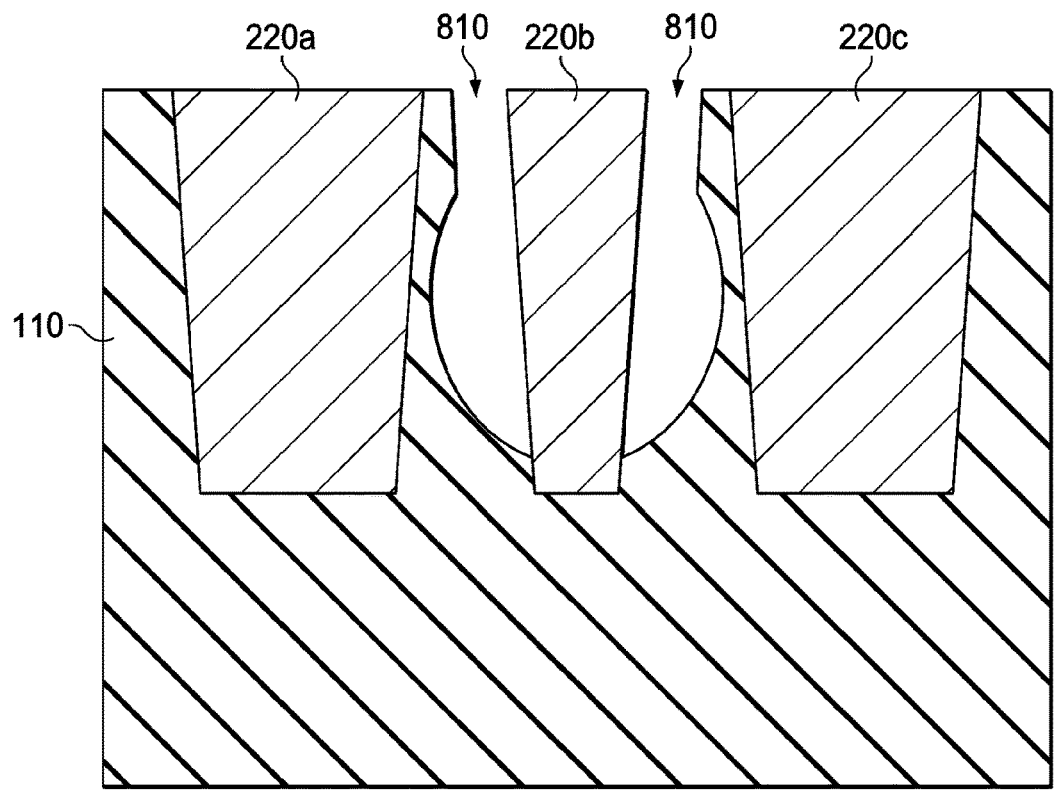
Figure 9C:
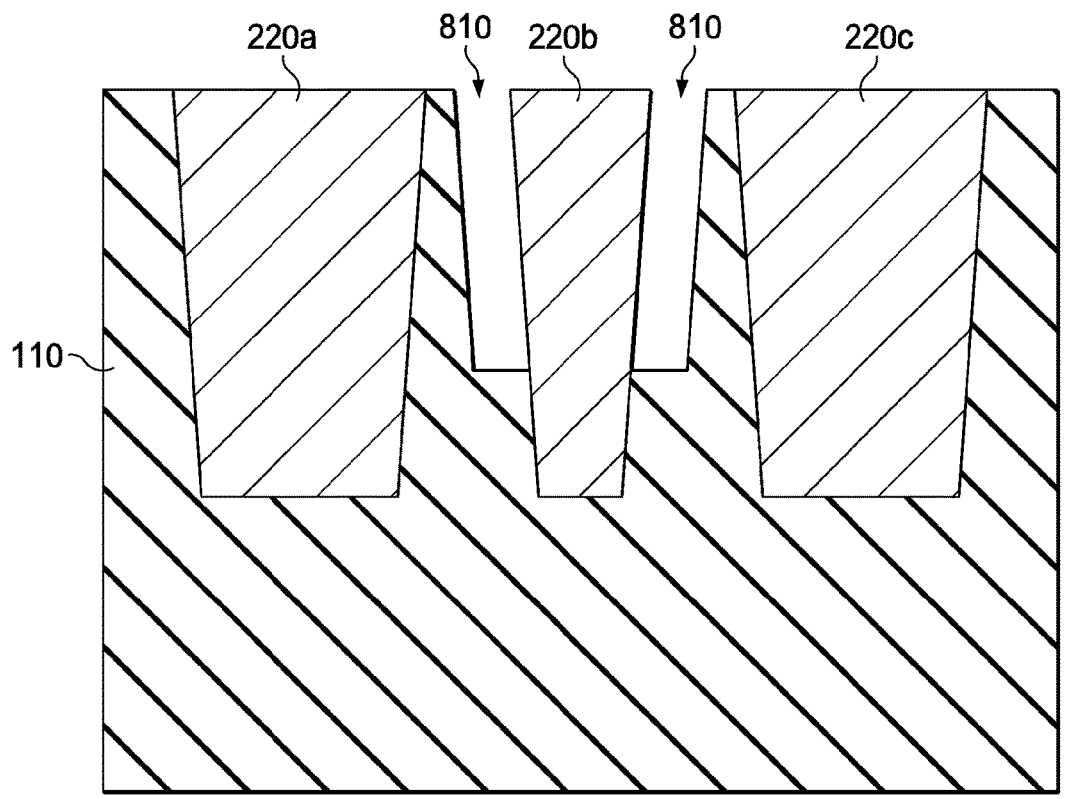

FIG. 8 illustrates openings 810 created adjacent to the narrower conductive line 220b in accordance with an embodiment. Using the mask 750 as an etch mask, the openings 810 may be formed using a variety of etch processes, selected to achieve a specific desired shape. For example, FIGS. 9A-9C illustrate various shapes that may be achieved with different etch processes. In an embodiment, the openings have a width of about 10% to about 90% of the space between 220a and 220b and a depth of about 10% to about 90% of the thickness of conductive lines.

FIG. 9A illustrates an air gap that may be achieved by a plasma etch using fluoride gases such as $CF_4$, $CH_2F_2$, $CHF_3$, $CH_3F$, $C_4F_8$, $C_4F_6$, $C_5F_8$ as main process gases to etch dielectrics, using $N_2$ or $O_2$ or $H_2$ as assistant gases, and using Ar or He or other inert gases as carrier gas. In this embodiment, an opening create by the etch process creates a tapered sidewall, creating a gap of material of the second dielectric layer 110 between opening and the conductive line.

FIG. 9B illustrates another example of an air gap, which may be achieved by a wet etch using F-containing solution to etch dielectrics, such as dilute HF or other organic F compounds to prevent attack on the metal conductive lines. In other embodiments, metal inhibitors may be added to prevent or reduce the solution attacking the conductive metal lines.

FIG. 9C illustrates yet another example of an air gap, which may be achieved by a vapor etch using HF or $NF_3$ gas as the main etching gas for dielectrics; $N_2$ or $NH_3$ or other N-contained gases as the assistant gases; and Ar or He or other inert gases as carrier gas. In an embodiment, a subsequent heating step (temperature from about 350K to about 600K) is performed to remove by-products on the dielectric films.

FIG. 8 also illustrates removal of the mask 750, which may be removed using an ashing process.

Figure 10:
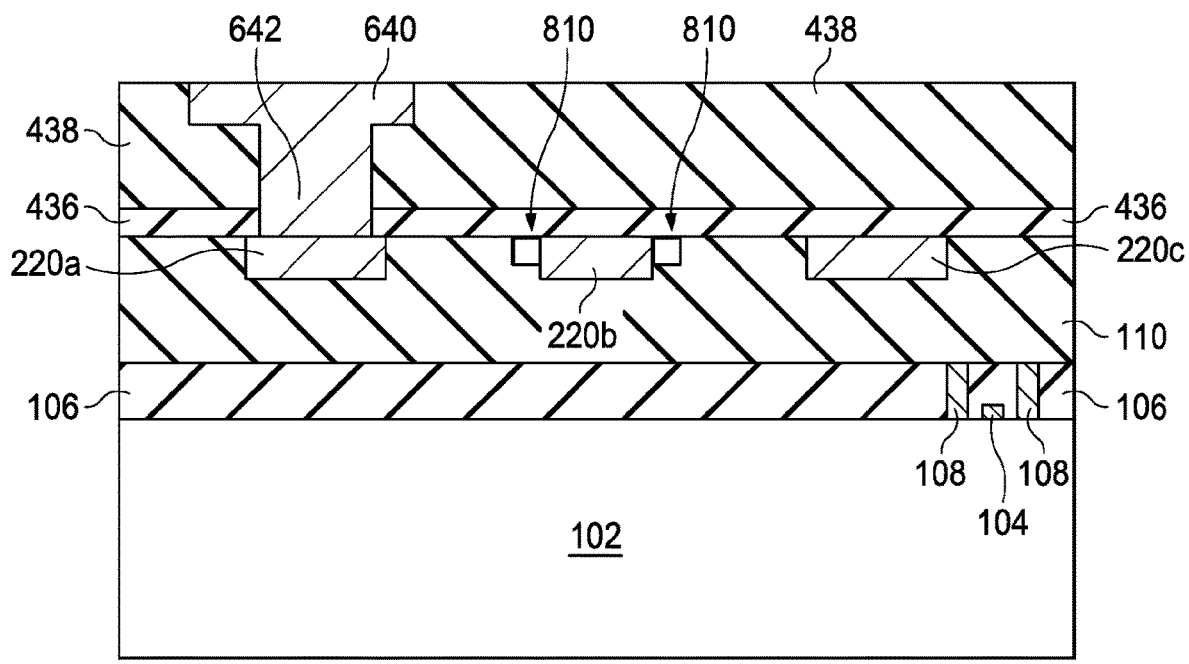

Referring now to FIG. 10, there is shown the device after processes similar to those discussed above with reference to FIGS. 4-6, wherein like reference numerals refer to like elements. In particular, FIG. 10 illustrates the ESL 436 and the third dielectric layer 438 formed over the second dielectric layer 110. Due to the small size of the openings 810 (see FIG. 8), the ESL 436, or other overlying layer, does not fill the openings 810, but rather seals the opening and creates an air gap or void adjacent to the narrower conductive line 220b.

FIG. 10 also illustrates a trench 640 and via 642 filled with a conductive material, thereby making an electrical contact to the conductive line 220a.

Figure 11A:
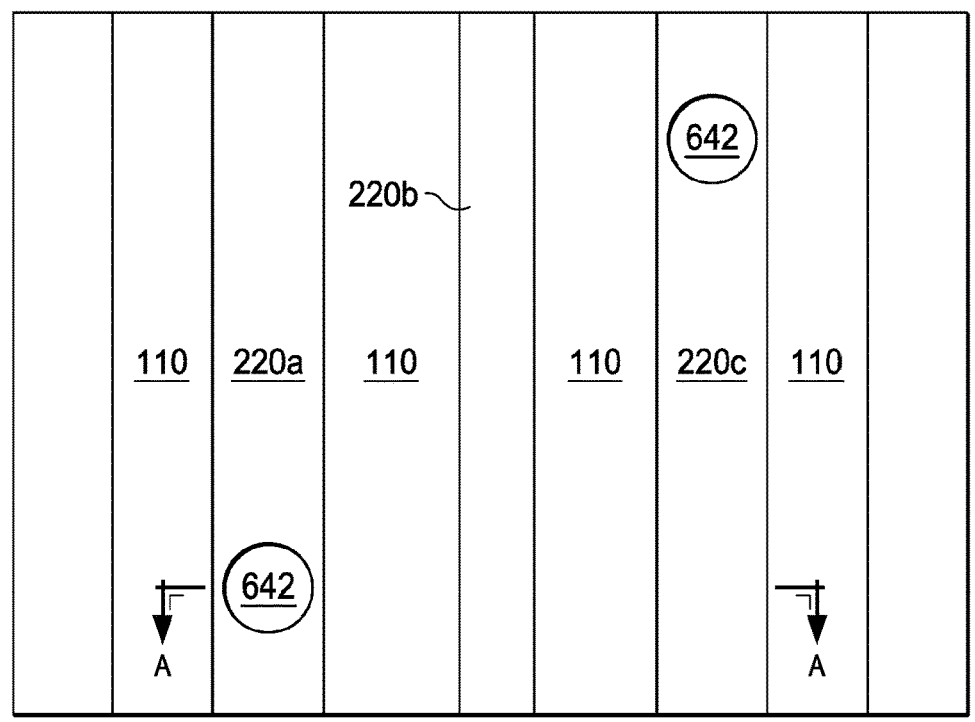
FIGS. 11A and 11B are plan views of embodiments.
Figure 11B:
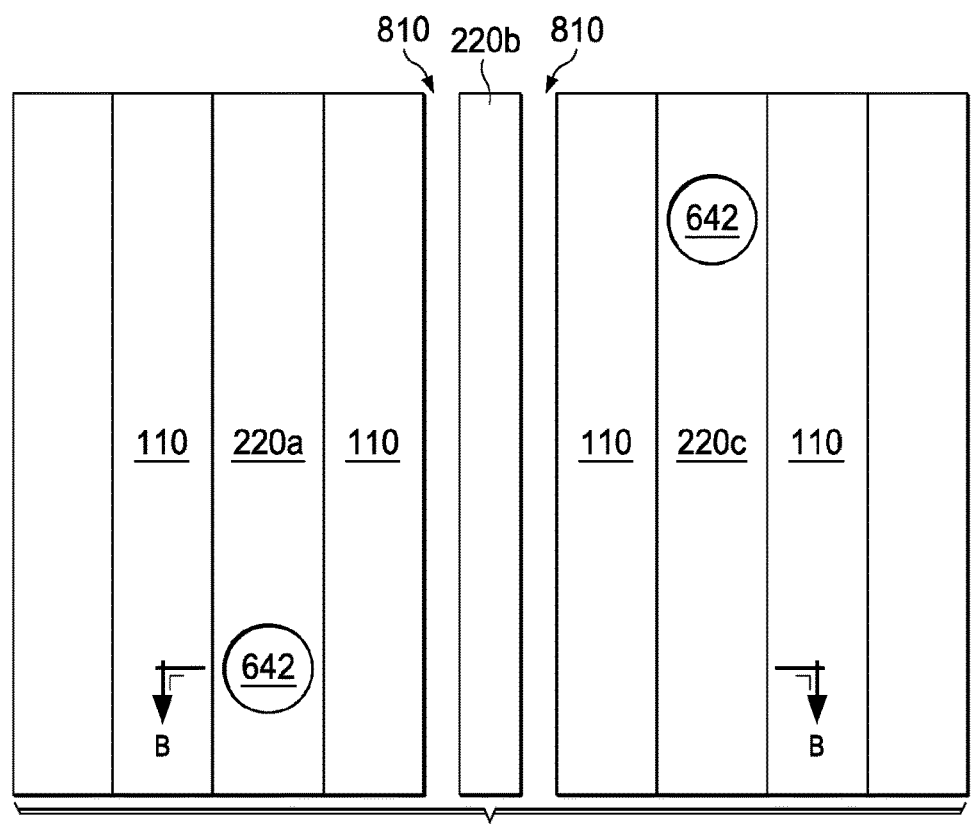
Figure 12:
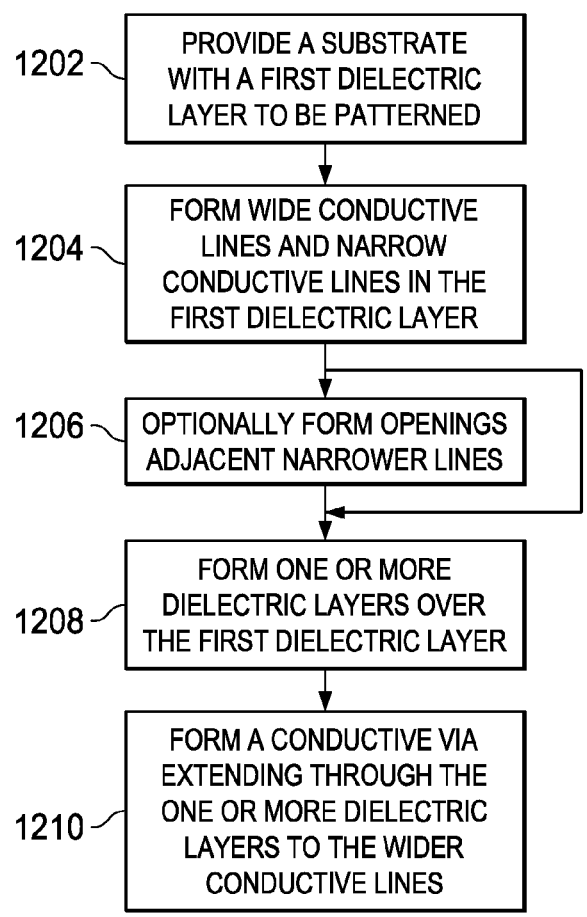
FIG. 12 is a flowchart illustrating a method of forming a semiconductor device in accordance with an embodiment.

FIGS. 11A and 11B illustrates a plan view illustrating the conductive lines 220a-c formed in the second dielectric layer 110, with a placement of the vias 642 shown. For reference FIGS. 1-6 are cross-sectional views taken along the A-A line of FIG. 11A, and FIGS. 7-10 are cross-sectional views taken along the B-B line of FIG. 11B. As shown in FIGS. 11A and 11B, the wider conductive lines 220a and 220c have contacting vias. The conductive lines not having a via contacting are narrower, such as narrower conductive line 220b FIG. 12 illustrates a flow chart illustrating a process of forming a structure in accordance with an embodiment. The process begins in step 1202, wherein a substrate having a first dielectric layer thereon is provided, such as that discussed above with reference to FIG. 1. The first dielectric layer may be an ILD layer and/or IMD layer. In step 1204, wide conductive lines and narrow conductive lines are formed, such as discussed above with reference to FIGS. 2-3. As discussed above, vias will be formed through an overlying layer. The wider conductive lines are used to provide wider lines to contact the vias, reducing electron migration and void formation.

In step 1206, openings are optionally formed adjacent to the narrower lines, such as those discussed above with reference to FIGS. 7-9. The openings create voids adjacent the narrower lines when overlying dielectric layers are formed. (See, e.g., FIG. 10.) In step 1208, one or more dielectric layers are formed over the first dielectric layer, such as those discussed above with reference to FIGS. 4 and 5. The dielectric layers are patterned to form a conductive via extending through the dielectric layers to the wider conductive lines, such as that discussed above with reference to FIGS. 5 and 6. In this embodiment, the narrower conductive lines are absent an overlying via.

In an embodiment, a method of forming an integrated circuit structure is provided. The method includes forming a plurality of conductive lines on a substrate such that a first conductive line is wider than a second conductive line. A dielectric layer is formed over the conductive lines, and a via is formed to connect to the first conductive line while no via connects directly to the second conductive line. Air gaps or voids may be formed adjacent to the narrower second conductive line.

In another embodiment, another method of forming an integrated circuit structure is provided. The method includes forming a first conductive element and a second conductive element in a first dielectric layer such that the first conductive element has a first width greater than a second width of the second conductive element. A second dielectric layer is formed over the first conductive element and the second conductive element, and a via is formed through the second dielectric layer to contact the first conductive element, while the second conductive element having the second width is entirely covered by the second dielectric layer. Air gaps or voids may be formed adjacent to the narrower second conductive line.

In yet another embodiment, a semiconductor device is provided. The semiconductor device includes a substrate having a first dielectric layer with a plurality of wide conductive lines and a narrow conductive line formed therein. A second dielectric layer overlies the first dielectric layer. Vias extend through the second dielectric layer to respective ones of the plurality of wide conductive lines, while the narrow conductive line being covered with the second dielectric layer Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
 a substrate;
 a first dielectric layer over the substrate; and
 a first conductive line, a second conductive line, and a third conductive line that are disposed in the first dielectric layer and laterally adjacent to each other, the first conductive line being between the second conductive line and the third conductive line, the first conductive line having air gaps on opposing sides, the air gaps extending into the first dielectric layer from an uppermost surface of the first dielectric layer distal from the substrate, the air gaps exposing opposing sidewalls of the first conductive line, bottoms of the air gaps being further from the substrate than a bottom surface of the first conductive line facing the substrate.

2. The semiconductor device of claim 1, further comprising:
 fourth conductive lines in the first dielectric layer, the fourth conductive lines having a width larger than a width of the first conductive line, wherein no air gap is disposed between the fourth conductive lines;
 a second dielectric layer over the first dielectric layer; and
 a via extending through the second dielectric layer and contacting one of the fourth conductive lines, the first conductive line being covered by the second dielectric layer.

3. The semiconductor device of claim 2, wherein no via contacts the first conductive line.

4. The semiconductor device of claim 1, wherein each of the air gaps has an upper portion proximate to the uppermost surface of the first dielectric layer and has a lower portion underlying the upper portion, wherein the upper portion has a first width that is smaller than a second width of the lower portion.

5. The semiconductor device of claim 4, wherein the upper portion has straight sidewalls and the lower portion has curved sidewalls.

6. The semiconductor device of claim 4, wherein upper sidewalls of the first conductive line are exposed by the air gaps, and lower sidewalls of the first conductive line are covered by the first dielectric layer.

7. The semiconductor device of claim 1, wherein a first air gap of the air gaps exposes a first sidewall of the first dielectric layer, and a second air gap of the air gaps exposes a second sidewall of the first dielectric layer, wherein a distance between the first sidewall and the second sidewall of the first dielectric layer decreases as the air gaps extend into the first dielectric layer toward the substrate.

8. The semiconductor device of claim 1, wherein a sidewall of the second conductive line facing the first conductive line is covered by a first portion of the first dielectric layer, and a sidewall of the third conductive line facing the first conductive line is covered by a second portion of the first dielectric layer.

9. A semiconductor device comprising:
a substrate;
a first dielectric layer over the substrate;
a plurality of conductive lines in the first dielectric layer;
a first void adjacent to a first conductive line of the plurality of conductive lines, the first void extending from an upper surface of the first dielectric layer distal from the substrate into the first dielectric layer by a first depth, the first void exposing a first sidewall of the first conductive line; and
a second void adjacent to the first conductive line, the second void extending from the upper surface of the first dielectric layer into the first dielectric layer by a second depth, the first void and the second void being on opposing sides of the first conductive line, the second void exposing a second sidewall of the first conductive line, the first depth and the second depth being smaller than a third depth of the first conductive line measured along a direction perpendicular to the upper surface of the first dielectric layer.

10. The semiconductor device of claim 9, wherein the first void further exposes a first sidewall of the first dielectric layer, wherein an upper portion of the first sidewall of the first dielectric layer has a linear profile, and a lower portion of the first sidewall of the first dielectric layer has a curved profile.

11. The semiconductor device of claim 9, wherein upper portions of the first and second sidewalls of the first conductive line are exposed by the first and second voids, and lower portions of the first and second sidewalls of the first conductive line are covered by the first dielectric layer.

12. The semiconductor device of claim 9, wherein a second conductive line of the plurality of conductive lines is laterally adjacent to the first conductive line, wherein a width of the second conductive line is between 1.03 and 3 times larger than a width of the first conductive line.

13. The semiconductor device of claim 12, further comprising:
a second dielectric layer over the first dielectric layer; and
a via in the second dielectric layer, the via connected to an upper surface of the second conductive line, an upper surface of the first conductive line being covered by the second dielectric layer.

14. A semiconductor device comprising:
a substrate;
a dielectric layer over the substrate;
a first conductive line in the dielectric layer, the first conductive line extending from an upper surface of the dielectric layer distal from the substrate into the dielectric layer by a first depth; and
a first air gap in the dielectric layer and adjacent to a first sidewall of the first conductive line, the first air gap extending from the upper surface of the dielectric layer into the dielectric layer by a second depth smaller than the first depth, wherein a first width of the first air gap decreases as the first air gap extends towards the substrate, wherein a first portion of the dielectric layer is disposed between the first air gap and the first sidewall of the first conductive line, wherein the first portion of the dielectric layer extends from the upper surface of the dielectric layer to a first bottom of the first air gap.

15. The semiconductor device of claim 14, wherein the first sidewall of the first conductive line is covered by the first portion of the dielectric layer.

16. The semiconductor device of claim 14, further comprising a second air gap in the dielectric layer and adjacent to a second sidewall of the first conductive line, the second air gap extending from the upper surface of the dielectric layer into the dielectric layer by a third depth smaller than the first depth, wherein a second width of the second air gap decreases as the second air gap extends towards the substrate, wherein a second portion of the dielectric layer is disposed between the second air gap and the second sidewall of the first conductive line, wherein the second portion of the dielectric layer extends from the upper surface of the dielectric layer to a second bottom of the second air gap.

17. The semiconductor device of claim 16, wherein a distance, measured between a first sidewall of the first portion of the dielectric layer facing away from the first conductive line and a second sidewall of the second portion of the dielectric layer facing away from the first conductive line, increases along a depth direction of the first air gap toward the substrate.

18. The semiconductor device of claim 14, further comprising a second conductive line in the dielectric layer and laterally adjacent to the first conductive line, wherein the first air gap is between the first conductive line and the second conductive line, wherein a second portion of the dielectric layer is between the first air gap and the second conductive line, wherein a width of the second portion of the dielectric layer increases as the second portion of the dielectric layer extends toward the substrate.

19. The semiconductor device of claim 18, wherein the first air gap is adjacent to a first sidewall of the second conductive line, wherein there is no air gap adjacent to a second opposing sidewall of the second conductive line.

20. The semiconductor device of claim 8, wherein a width of the first portion of the first dielectric layer increase as the first portion of the first dielectric layer extends toward the substrate.

* * * * *